United States Patent
Zhang et al.

(10) Patent No.: US 7,386,411 B2
(45) Date of Patent: Jun. 10, 2008

(54) AUTOMATIC HI-POT TEST APPARATUS AND METHOD

(75) Inventors: Yan-Kai Zhang, Shenzhen (CN); Jun-Hua Yang, Shenzhen (CN); Yi Wang, Shenzhen (CN)

(73) Assignees: Innocom Technology (Shenzhen) Co., Ltd., Shenzhen, Guangdong Province (CN); Innolux Display Corp., Miao-Li County (TW)

( * ) Notice: Subject to any disclaimer, the term of this patent is extended or adjusted under 35 U.S.C. 154(b) by 0 days.

(21) Appl. No.: 11/474,622

(22) Filed: Jun. 26, 2006

(65) Prior Publication Data

US 2007/0005287 A1    Jan. 4, 2007

(30) Foreign Application Priority Data

Jun. 24, 2005   (TW) .............................. 94121214 A

(51) Int. Cl.
 *H01H 9/50*  (2006.01)
 *G01R 31/08* (2006.01)
 *G01R 31/12* (2006.01)

(52) U.S. Cl. ...................... 702/108; 702/118; 702/119; 324/536; 324/537; 324/538; 324/539; 324/540; 324/541; 714/47; 714/48; 714/49; 714/50; 714/51

(58) Field of Classification Search ........ 702/118–119; 324/536–541; 714/47–51
See application file for complete search history.

(56) References Cited

U.S. PATENT DOCUMENTS 6,815,956 B2    11/2004  Weldin et al.
7,020,571 B2 *   3/2006  Lee ............................ 702/119

FOREIGN PATENT DOCUMENTS

CN     094121214   *   6/2005

* cited by examiner

*Primary Examiner*—John Barlow
*Assistant Examiner*—Sujoy Kundu
(74) *Attorney, Agent, or Firm*—Wei Te Chung

(57) ABSTRACT

An exemplary automatic hi-pot test apparatus (20) includes a high voltage supply (21), a transmission device configured for transmitting an electronic device (26) to be tested, a connecting device electrically connected to the high voltage supply and configured for moving and electrically connecting with or electrically disconnecting from the electronic device, a controller (28) for controlling the connecting device and the transmission device, and a detector (27) for detecting the presence of the electronic device. When the detector detects the presence of the electronic device, the detector sends a corresponding detecting signal to the controller, such that the controller stops the electronic device and drives the connecting device to electrically connect with the electronic device whereby a hi-pot test can be performed. When the hi-pot test is finished, the controller drives the connecting device to disconnect from the electronic device whereby the electronic device can transmit elsewhere by operation of the transmission device.

15 Claims, 4 Drawing Sheets

AUTOMATIC HI-POT TEST APPARATUS AND METHOD

FIELD OF THE INVENTION

The present invention relates to apparatus and methods for testing characteristics of newly manufactured products, and more particularly to an automatic hi-pot test apparatus and an automatic hi-pot test method typically used in an electronic device testing line.

GENERAL BACKGROUND

Electronic device manufacturers take many precautions to ensure the safety, quality, and reputation of their products. For example, an electronic device manufacturer typically employs a variety of rigorous functional tests on electronic devices before dispatch from the factory. Such tests may include a temperature test, a waterproofness test, an electrical conductivity test, an insulation test, a current test and a hi-pot test. Each test assures that an important product characteristic meets required standards, and is an indispensable step in the whole quality control procedure before the electronic device is finally shipped out from the factory for distribution and sale. Among the test items mentioned above, the hi-pot test for testing voltage tolerance merits extra attention over the others due to safety concerns. That is, the functions performed by the electronic device depend on the inputting of voltage to drive operation of various electronic components within the electronic device. Therefore accurate and thorough test procedures are critical in order to obtain reliable test results which can form the basis for determining whether the electronic components have the ability to withstand a voltage overload. If the electronic components do not undergo a complete hi-pot test procedure, the safety of a user of the electronic device is in doubt. In summary, electronic device manufacturers are responsible for performing strict safety checks of their products before shipment, so as to guarantee product safety for users and maintain a good reputation among consumers.

Currently, a typical electronic device manufacturer executes the hi-pot test procedure in its production line by having operators manually operate the hi-pot test instruments. The operators then sort out passed electronic devices from failed ones based on their test results, and scan the bar code of each electronic device to record the test results in a factory information system (FIS) for quality control reference.

In practice, the speed, efficiency, and accuracy of manually performing the test procedures largely depends on the consistency and steadiness of the operators. Hi-pot testing is reputed to be a highly repetitive and mind-numbing task that easily fatigues operators and creates potential for human error. This can result in defects and inaccuracies anywhere in the entire test process. In many respects, the conventional way of conducting tests manually cannot satisfy stringent requirements for precise and accurate results needed to ensure the safety, quality and reliability of electronic devices. This is particularly the case with modern electronic devices, which typically have complex interconnections of a variety of electrical modules packaged into a compact electronic device housing.

Therefore, an automatic hi-pot test apparatus that can overcome the above-described problems is desired.

SUMMARY

In a preferred embodiment, an automatic hi-pot test apparatus includes a high voltage supply, a transmission device configured for transmitting an electronic device to be tested, a connecting device electrically connected to the high voltage supply and configured for moving and electrically connecting with or electrically disconnecting from the electronic device, a controller for controlling the connecting device and the transmission device, and a detector for detecting the presence of the electronic device. When the detector detects the presence of the electronic device, the detector sends a corresponding detecting signal to the controller, such that the controller stops the electronic device and drives the connecting device to electrically connect with the electronic device whereby a hi-pot test can be performed. When the hi-pot test is finished, the controller drives the connecting device to disconnect from the electronic device whereby the electronic device can transmit elsewhere by operation of the transmission device.

Other advantages and novel features will become more apparent from the following detailed description when taken in conjunction with the accompanying drawings.

DETAILED DESCRIPTION OF PREFERRED EMBODIMENTS

Figure 1:
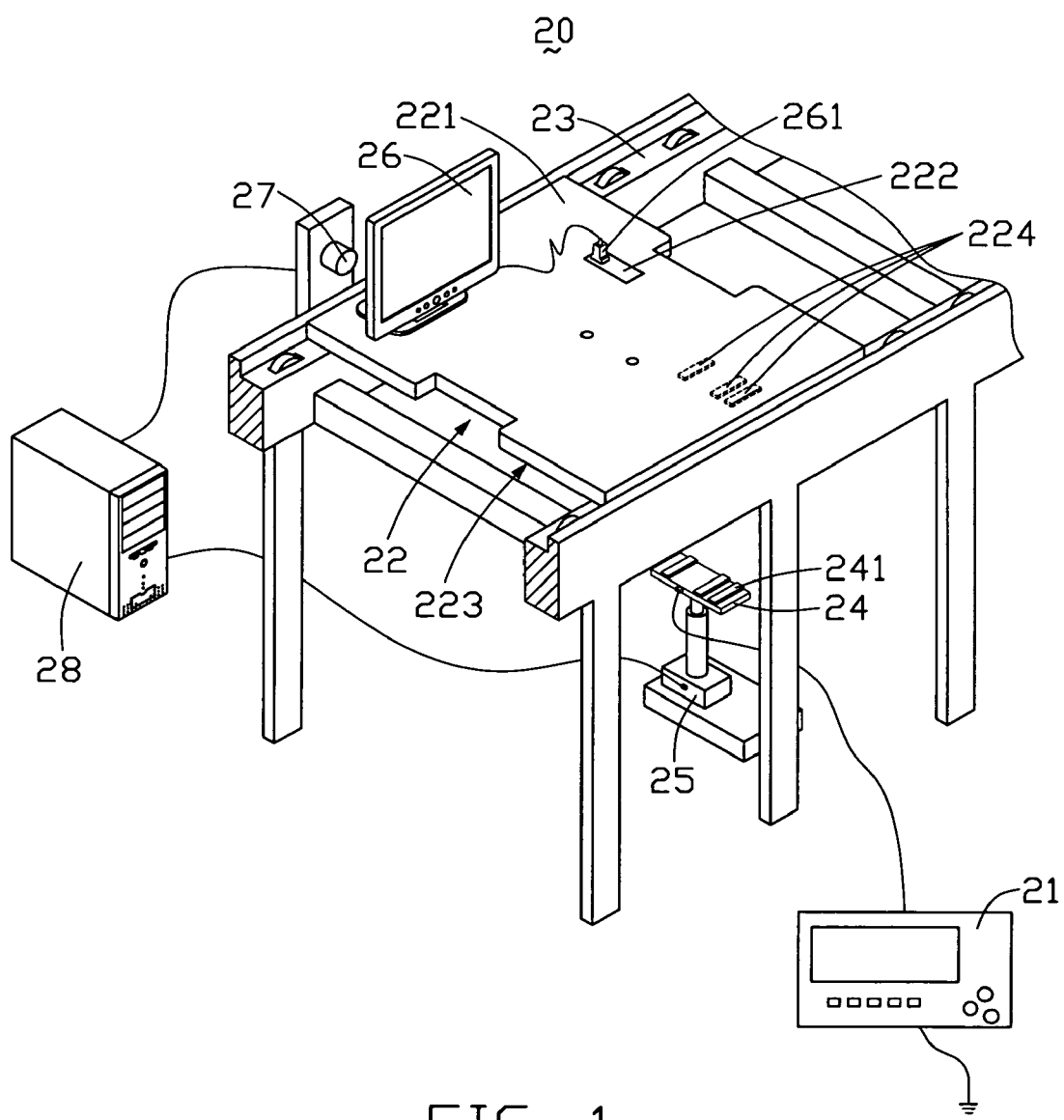
FIG. 1 is essentially an isometric view of part of an automatic hi-pot test apparatus according to a first embodiment of the present invention together with an electronic device positioned thereon, the hi-pot test apparatus including a contact plate.
Figure 2:
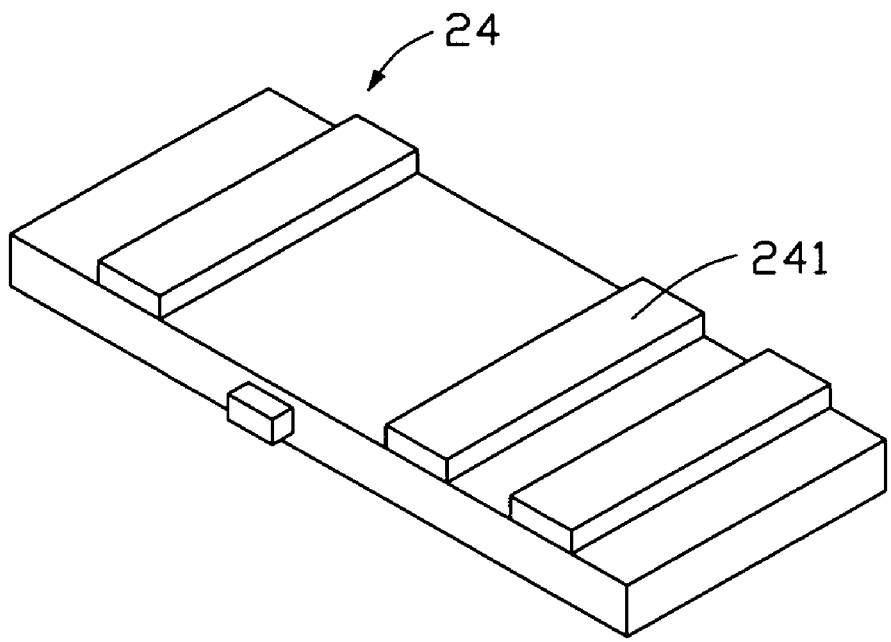
FIG. 2 is an enlarged view of the contact plate of FIG. 1.

FIG. 1 shows an automatic hi-pot test apparatus according to a first embodiment of the present invention, together with an electronic device positioned thereon. The automatic hi-pot test apparatus 20 is typically used in an electronic device testing line, and includes a high voltage supply 21, a board 22, two guide rails 23 slidably supporting the board 21, a contact plate 24, a piston driver 25 for mechanically controlling the contact plate 24, a detector 27, and a controller 28. The board 22 has a power socket 222 disposed at a top surface 221 thereof, and three conducting strips 224 disposed on a bottom surface 223 thereof. The conducting strips 224 are electrically connected with the power socket 222. Also referring to FIG. 2, the contact plate 24 is supported by the piston driver 25. The contact plate 24 includes three strip-shaped contact pads 241 attached on a main body thereof, the contact pads 241 respectively corresponding to the three conducting strips 224 of the board 22. The piston driver 25 may include a pneumatic cylinder or a hydraulic cylinder. The piston driver 25 can extend and push the contact plate 24 up to make the contact pads 241 respectively contact the conducting strips 224, and can retract and bring the contact plate 24 down so as to separate the contact pads 241 from the conducting strips 224. The detector 27 is used to detect the presence of an electronic device 26 to be tested, and send a corresponding detecting signal to the controller 28. The controller 28 is used to control the guide rails 23 and the piston driver 25 according to the detecting signal. The controller 28 is generally a host computer.

Typical operation of the automatic hi-pot test apparatus 20 is as follows. The electronic device 26 is positioned on the board 22, and a power plug 261 of the electronic device 26 is connected in the power socket 222 of the board 22. The electronic device 26 on the board 22 is transmitted by the guide rails 23 toward a testing area that includes the high voltage supply 21. When the electronic device 26 arrives at the testing area, the detector 27 detects the presence of the electronic device 26, and sends a corresponding detecting signal to the controller 28. Upon receiving the detecting signal, the controller 28 sends a first control signal to a stopper (not shown) and the piston driver 25 respectively. The stopper moves and stops the board 22 in position at the testing area. The piston driver 25 extends and pushes the contact plate 24 up to make the contact pads 241 contact the conducting strips 224 of the board 22, thus establishing electrical connection between the high voltage supply 21 and the electronic device 26. A hi-pot test is then automatically performed under control of the controller 28. When the hi-pot test is finished, the controller 28 sends a second control signal to the piston driver 25 and the stopper respectively. The piston driver 25 retracts and brings the contact plate 24 down to separate the contact pads 241 from the conducting strips 224, thus cutting off the electrical connection between the high voltage supply 21 and the electronic device 26. The stopper moves and lets the board 22 pass along the guide rails 23. Thereby, the board 22 with the electronic device 26 is transmitted away from the testing area. Typically, the board 22 with the electronic device 26 transmits to a next testing area. In this way, the testing area is vacated to allow a next board 22 (not shown) with a next electronic device 26 (not shown) to arrive at the testing area.

In summary, the detector 27 detects the presence of the electronic device 26 on the board 22, the controller 28 controls the stopper to stop the board 22 or let the board 22 pass as needed, and the controller 28 controls the piston driver 25 which can electrically connect or disconnect the electronic device 26 to or from the high voltage supply 21, with the controller controlling the stopper to stop the board and the piston driver 25 to electrically connect the electronic device 26 according a detecting result received from the detector 27. By means of this cooperation, the automatic hi-pot test apparatus 20 automatically connects the electronic device 26 with the high voltage supply 21, performs a hi-pot test, and transmits the board 22 with the electronic device 26 away from the testing area. Therefore, the automatic hi-pot test apparatus can satisfy rigorous requirements for precise and accurate testing of the electronic devices 26 with little or no risk of human error or delay. That is, the quality of the electronic devices 26 can be efficiently tested and ensured. Moreover, operators are removed from the possibility of being accidentally injured by high voltages used during the hi-pot test. Thus the automatic hi-pot test apparatus 20 also has a high level of safety.

Figure 3:
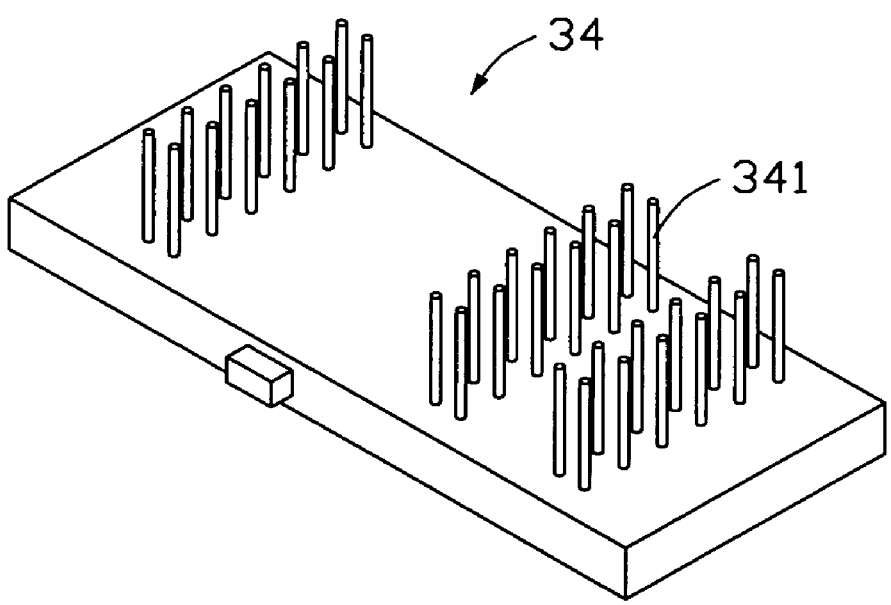
FIG. 3 is an isometric view of a contact plate of an automatic hi-pot test apparatus according to a second embodiment of the present invention.

FIG. 3 shows a contact plate of an automatic hi-pot test apparatus according to a second embodiment of the present invention. The automatic hi-pot test apparatus is similar to the automatic hi-pot test apparatus 20 of the first embodiment, except that the contact plate 34 is used instead of the contact plate 24. The contact plate 34 includes three contact pin arrays, each of which includes two rows of contact pins 341 attached on a main body of the contact plate 34. This configuration can avoid electrical sparking which may otherwise occur when two adjacent conducting strips 224 are incompletely connected to the high voltage supply 21. That is, the safety and reliability of the automatic hi-pot test apparatus is further enhanced.

Figure 4:
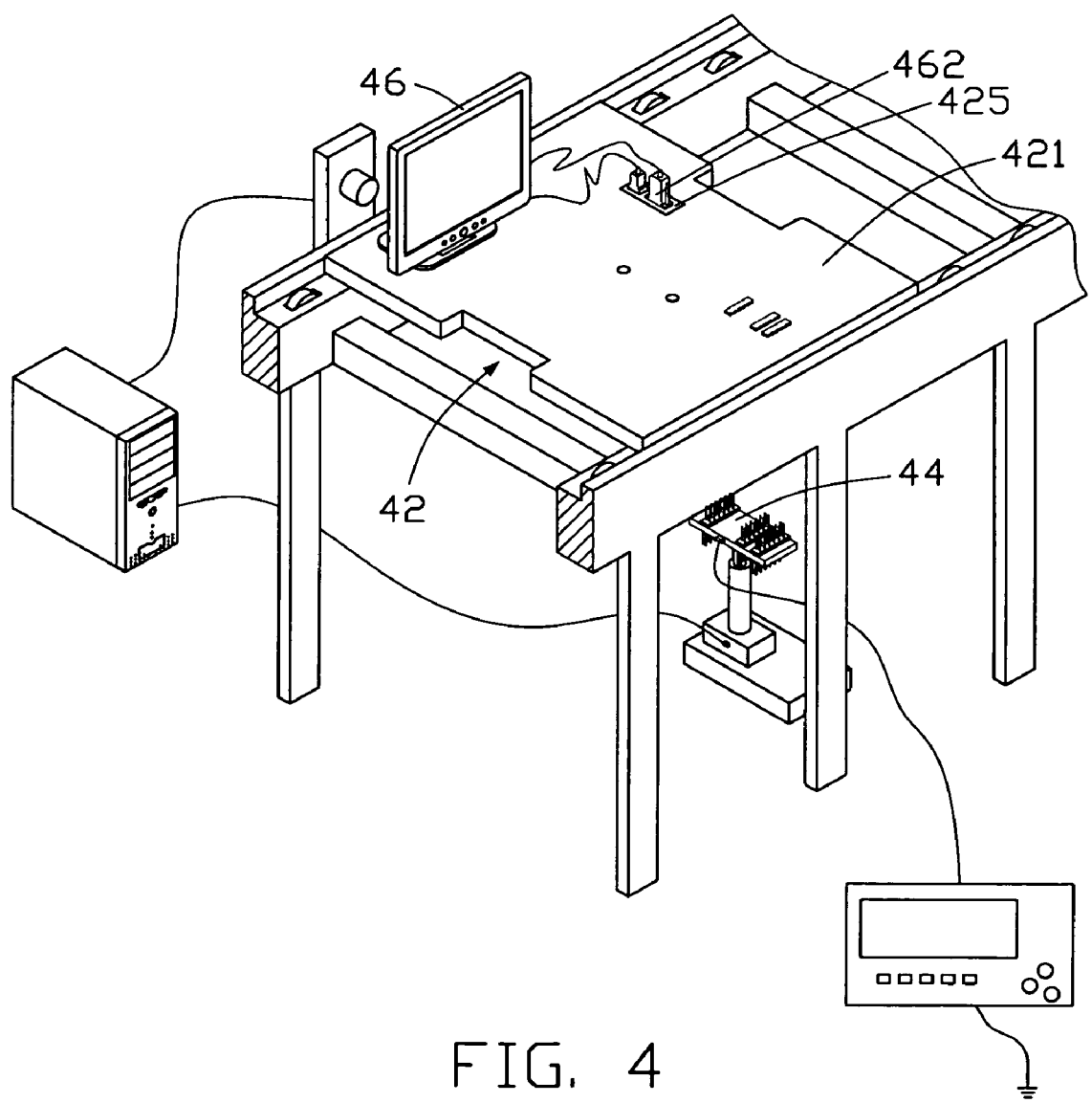
FIG. 4 is essentially an isometric view of part of an automatic hi-pot test apparatus according to a third embodiment of the present invention together with an electronic device positioned thereon, the hi-pot test apparatus including a contact plate.
Figure 5:
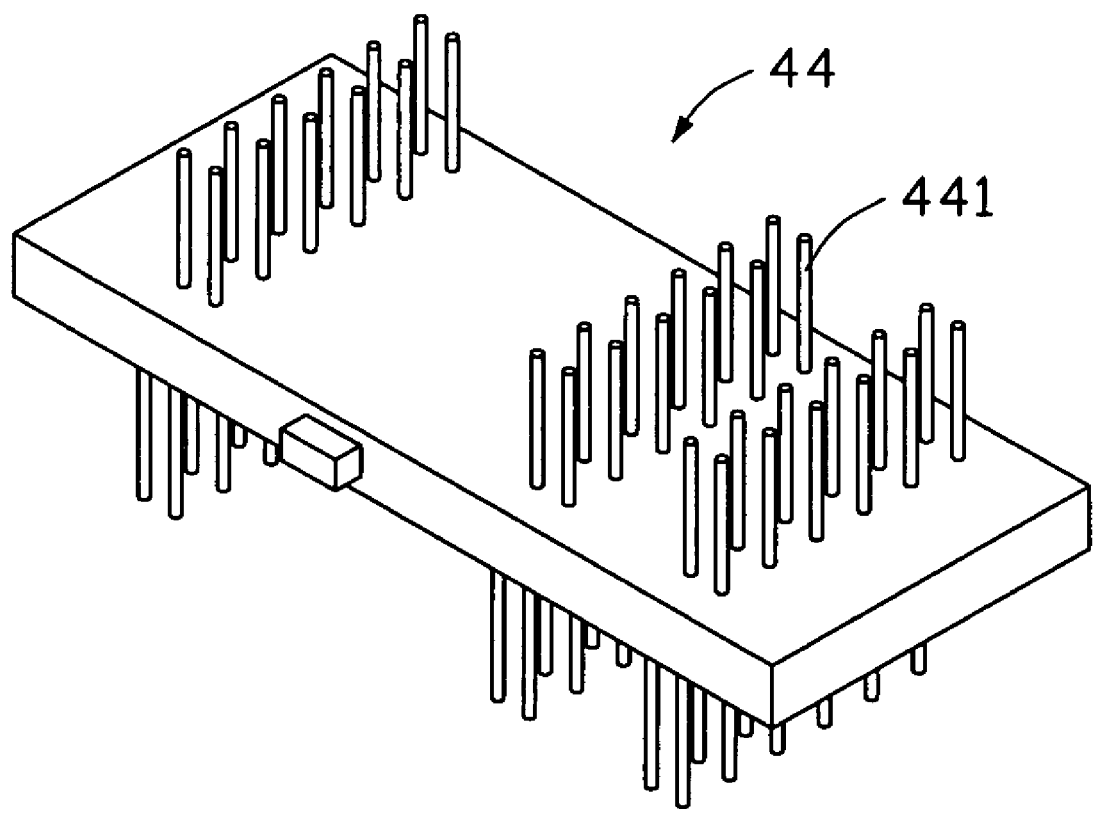
FIG. 5 is an enlarged view of the contact plate of FIG. 4.

Referring to FIGS. 4 and 5, an automatic hi-pot test apparatus according to a third embodiment of the present invention is similar to the automatic hi-pot test apparatus 20 of the first embodiment, except that in the third embodiment, a board 42 is used instead of the board 22, and a contact plate 44 is used instead of the contact plate 24. The board 42 further includes a signal socket 425 disposed at a top surface 421 thereof together with the power socket 222. Contact pins 441 of the contact plate 44 penetrate through and protrude from a bottom of a main body of the contact plate 44. A signal plug 462 of an electronic device 46 to be tested can be connected in the signal socket 425 of the board 42. Thereby, a current test can be performed on the electronic device 46.

In alternative embodiments of the above-described automatic hi-pot test apparatuses of the second and third embodiments, each needle array can include three or more rows of needles.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An automatic hi-pot test apparatus comprising:
a high voltage supply;
a transmission device configured for transmitting an electronic device to be tested, the transmission device comprising a board for carrying the electronic device, the board comprising a power socket configured for connecting with a power plug of the electronic device, and a connector electrically connected with the power socket;
a connecting device comprising a contact member corresponding to the connector of the board, the contact member being electrically connected to the high voltage supply, and configured for moving and electrically connecting with or electrically disconnecting from the connector of the electronic device;
a controller for controlling the connecting device and the transmission device; and
a detector for detecting the presence of the electronic device;
wherein when the detector detects the presence of the electronic device, the detector sends a corresponding detecting signal to the controller, such that the controller stops the electronic device and drives the connecting device to electrically connect with the electronic device whereby a hi-pot test can be performed, and when the hi-pot test is finished, the controller drives the connecting device to disconnect from the electronic device whereby the electronic device can transmit elsewhere by operation of the transmission device.

2. The automatic hi-pot test apparatus as claimed in claim 1, wherein the transmission device further comprises a pair of guide rails slidably supporting the board.

3. The automatic hi-pot test apparatus as claimed in claim 1, wherein the connecting device further comprises a driver, which is controlled by the controller and mechanically drives the contact member.

4. The automatic hi-pot test apparatus as claimed in claim 3, wherein the driver comprises a pneumatic cylinder.

5. The automatic hi-pot test apparatus as claimed in claim 3, wherein the driver comprises a hydraulic cylinder.

6. The automatic hi-pot test apparatus as claimed in claim 1, wherein the connector of the board comprises a plurality of conducting strips.

7. The automatic hi-pot test apparatus as claimed in claim 6, wherein the contact member comprises a plurality of contact portions corresponding to the conducting strips of the board.

8. The automatic hi-pot test apparatus as claimed in claim 7, wherein the contact portions are strip-shaped.

9. The automatic hi-pot test apparatus as claimed in claim 8, wherein the contact portions are attached on a main body of the contact member.

10. The automatic hi-pot test apparatus as claimed in claim 7, wherein the contact portions are pm-shaped, and are attached on a main body of the contact member in a plurality of arrays corresponding to the conducting strips of the board.

11. The automatic hi-pot test apparatus as claimed in claim 10, wherein the contact portions penetrate through and protrude from a bottom of the main body of the contact member.

12. The automatic hi-pot test apparatus as claimed in claim 1, wherein the board further comprises a signal socket configured for connecting with a signal plug of the electronic device. wherein the signal socket is electrically connected with the connector.

13. The automatic hi-pot test apparatus as claimed in claim 1, wherein the controller comprises a host computer.

14. An automatic hi-pot test method comprising:
sending a detecting signal to a controller when a detector detects the presence of an electronic device to be tested;
stopping the electronic device in a desired position via the controller according to the detecting signal;
driving a connecting device to electrically connect the electronic device with a high voltage supply;
automatically performing a hi-pot test under control of the controller and obtaining a hi-pot test result of the electronic device; and
driving the connecting device to disconnect the electronic device from the high voltage supply when the controller determines that the hi-pot test is finished, whereby the electronic device can be transmitted elsewhere.

15. An automatic hi-pot test apparatus comprising:
a high voltage supply;
a connecting device electrically connected to the high voltage supply, and configured for moving and electrically connecting with or electrically disconnecting from the electronic device;
a controller for controlling the connecting device; and
a detector for detecting the presence of the electronic device;
wherein when the detector detects the presence of the electronic device, the detector sends a corresponding detecting signal to the controller, such that the controller drives one of the connecting device and the electronic device to electrically connect with the other of the connecting device and the electronic device whereby a hi-pot test can be performed, and when the hi-pot test is finished, the controller oppositely drives said one of the connecting device and the electronic device to electrical disconnect from the other of the connecting device and the electronic device whereby the electronic device can transmit elsewhere.

* * * * *